United States Patent [19]
Cooperman

[11] Patent Number: 6,038,229
[45] Date of Patent: Mar. 14, 2000

[54] TREE SWITCHING WITH FAST RECONFIGURATION

[75] Inventor: Michael Cooperman, Framingham, Mass.

[73] Assignee: GTE Laboratories Incorporated, Waltham, Mass.

[21] Appl. No.: 08/994,285

[22] Filed: Dec. 19, 1997

[51] Int. Cl.[7] .......................... H04L 12/50; G01R 31/08; H04J 3/04; H01H 67/00

[52] U.S. Cl. ..................... 370/388; 370/388; 370/243; 370/112; 370/113; 340/825.8; 340/825.02

[58] Field of Search .................................. 370/243, 112, 370/79, 84, 94, 539, 541; 340/825.8, 825.02, 825.89, 825.91, 825.87

[56] References Cited

U.S. PATENT DOCUMENTS

| | | | |
|---|---|---|---|
| 3,614,327 | 10/1971 | Low et al. ............................. | 179/15 A |
| 4,504,943 | 3/1985 | Negano et al. ............................ | 370/79 |
| 4,686,645 | 8/1987 | McCanny et al. ....................... | 364/754 |
| 4,912,339 | 3/1990 | Bechade et al. ......................... | 307/243 |
| 5,212,587 | 5/1993 | Healey ..................................... | 359/301 |
| 5,243,599 | 9/1993 | Barrett et al. ............................ | 370/112 |
| 5,319,597 | 6/1994 | Adachi .................................... | 365/189 |
| 5,635,857 | 6/1997 | Flora ......................................... | 328/39 |
| 5,892,920 | 4/1999 | Arvidsson et al. ................ | 395/700.63 |

*Primary Examiner*—Michael Horabik
*Assistant Examiner*—Man Phan
*Attorney, Agent, or Firm*—Leonard Charles Suchyta; Floyd E. Anderson

[57] ABSTRACT

This invention relates to the fast reconfiguration of tree switches. In particular, on-chip parallel control signals are time staggered so that they track the propagation of data or information bits. As a result, it is unnecessary to stop the flow of data bits from the data inputs to the data outputs during the reconfiguration of the tree switch.

3 Claims, 7 Drawing Sheets

| Input Number | 0 | 1 | 2 | 3 | 4 | 5 | 6 | 7 | |
|---|---|---|---|---|---|---|---|---|---|
| Input Stage #1 | $(0_0)$ | $0_1$ | $0_2$ | $0_3$ | $0_4$ | $0_5$ | $0_6$ | $0_7$ | |
| Input Stage #2 | | $(0_0)$ | | $0_2$ | | $0_4$ | | $0_6$ | $C0 = 0$ |
| Input Stage #3 | | | $(0_0)$ | | | | $0_4$ | | $C1 = 0$ $C2 = 0$ |
| Output Terminal | | | | | $(0_0)$ | | | | |

Fig. 3A

| Input Number | 0 | 1 | 2 | 3 | 4 | 5 | 6 | 7 | |
|---|---|---|---|---|---|---|---|---|---|
| Input Stage #1 | $1_0$ | $1_1$ | $1_2$ | $1_3$ | $1_4$ | $1_5$ | $1_6$ | $(1_7)$ | |
| Input Stage #2 | | $(0_0)$ | | $0_2$ | | $0_4$ | | $0_6$ | $C0 = 1$ |
| Input Stage #3 | | | $(0_0)$ | | | | $0_4$ | | $C1 = 0$ $C2 = 0$ |
| Output Terminal | | | | | $(0_0)$ | | | | |

Fig. 3B

| Input Number | 0 | 1 | 2 | 3 | 4 | 5 | 6 | 7 | |
|---|---|---|---|---|---|---|---|---|---|
| Input Stage #1 | $1_0$ | $1_1$ | $1_2$ | $1_3$ | $1_4$ | $1_5$ | $1_6$ | $(1_7)$ | |
| Input Stage #2 | | $1_1$ | | $1_3$ | | $1_5$ | | $(1_7)$ | $C0 = 1$ |
| Input Stage #3 | | | $(0_0)$ | | | | $0_4$ | | $C1 = 1$ $C2 = 0$ |
| Output Terminal | | | | | $(0_0)$ | | | | |

Fig. 3C

| Input Number | 0 | 1 | 2 | 3 | 4 | 5 | 6 | 7 |
|---|---|---|---|---|---|---|---|---|
| Input Stage #1 | $1_0$ | $1_1$ | $1_2$ | $1_3$ | $1_4$ | $1_5$ | $1_6$ | $(1_7)$ |
| Input Stage #2 | | $1_1$ | | $1_3$ | | $1_5$ | | $(1_7)$ |
| Input Stage #3 | | | | $1_3$ | | | | $(1_7)$ |
| Output Terminal | | | | $(0_0)$ | | | | |

| Input Number | 0 | 1 | 2 | 3 | 4 | 5 | 6 | 7 |
|---|---|---|---|---|---|---|---|---|
| Input Stage #1 | $1_0$ | $1_1$ | $1_2$ | $1_3$ | $1_4$ | $1_5$ | $1_6$ | $(1_7)$ |
| Input Stage #2 | | $1_1$ | | $1_3$ | | $1_5$ | | $(1_7)$ |
| Input Stage #3 | | | | $1_3$ | | | | $(1_7)$ |
| Output Terminal | | | | $(1_7)$ | | | | |

| Input Number | 0 | 1 | 2 | 3 | 4 | 5 | 6 | 7 |
|---|---|---|---|---|---|---|---|---|
| Input Stage #1 | $1_0$ | $1_1$ | $1_2$ | $1_3$ | $1_4$ | $1_5$ | $1_6$ | $(1_7)$ |
| Input Stage #2 | | $1_1$ | | $1_3$ | | $1_5$ | | $(1_7)$ |
| Input Stage #3 | | | | $1_3$ | | | | $(1_7)$ |
| Output Terminal | | | | $(1_7)$ | | | | |

TREE SWITCHING WITH FAST RECONFIGURATION

BACKGROUND OF THE INVENTION

The present invention relates generally to broadband switching, and more particularly to fast reconfiguration of packet switching and asynchronous transfer mode (ATM) switching.

FIG. 1 shows a diagram of a conventional tree switch circuit 100. As shown, circuit 100 includes eight data inputs IN0–IN7. The use of eight inputs, however, is merely exemplary. In general, the number of inputs will be $2^N$, N being an integer greater than zero. Data inputs IN0–IN7 are received by a respective line of a plurality of data lines 110. Each line of data lines 110 is coupled to both 8×1 tree switch 120 and 8×1 tree switch 130 to couple data inputs IN0–IN7 to both tree switches as input signals. Tree switches 120 and 130 are the first and eighth tree switches of tree switch 100 with the intervening 8×1 tree switches omitted. Control inputs C0–C2 control tree switches 120 and 130 to produce data output signals OUT0 and OUT7, respectively, based on the input signals from data inputs IN0–IN7. The number of control inputs is equal to N.

Tree switches 120 and 130 each include N stages, N in this example being three, forming a cascade tree of seven 2:1 selectors, which are controlled by control inputs C0–C2. Stage #1 of tree switches 120 and 130 includes four 2:1 selectors, which are controlled by control input C0 to select four even (IN0, IN2, IN4, and IN6) or four odd numbered inputs (IN1, IN3, IN5, IN7). Similarly, stage #2 includes two 2:1 selectors, which are controlled by control input C1 to select two of the four outputs supplied by the four 2:1 selectors of stage #1. Finally, stage #3 includes one 2:1 selector, which is controlled by control input C2 to select one of the two outputs supplied by the two 2:1 selectors of stage #2. The outputs of the 2:1 selectors of stage #3 constitute the data output signals OUT0 and OUT7 of tree switches 120 and 130, respectively. Thus, the eight combinations of control inputs C0–C2 control tree switches 120 and 130 to pass any one of the eight data inputs IN0–IN7 to a particular data output.

Tree switch designs offer several advantages as compared to X-Y space switch architectures. For example, each selector stage of a tree structure drives only one input of the following stage, thereby minimizing the capacitive loading on the selector outputs, resulting in a high output bit-rate. In addition, in X-Y space switches, $2^N$ inputs require $2^N$ on-chip control lines. In a tree switch, however, $2^N$ inputs only require N on-chip control lines, which eliminates on-chip decoders and minimized delay in the control path.

The following is an example of circuit 100 in operation. Assume that data input IN0 is coupled to data output OUT0, and data input IN7 is coupled to data output OUT7. From this initial setting, circuit 100 is to be reconfigured so that data input IN7 is coupled to data output OUT0, and data input IN0 is coupled to data output OUT7. Note that the bits of data inputs IN0–IN7 arrive in synchronization as input signals for tree switches 120 and 130 by a clock (not shown). The reconfiguration of circuit 100 includes a three-step process.

In the first step, circuit 100 waits until the last bit of data input IN0 has propagated through tree switch 120 to data output OUT0, and the last bit of data input IN7 has propagated through tree switch 130 to data output OUT0. Subsequently, the combinations of control inputs C0–C2 are altered for tree switches 120 and 130 to connect data input IN0 to data output OUT7 and data input IN7 to data output OUT0. During this alteration to reconfigure the connections between the data inputs and outputs, the paths through tree switches 120 and 130 for connecting the data inputs and outputs are indeterminate.

In the last step, after the path from data input IN0 to data output OUT0 has reached a stable disconnected state and the path from data input IN7 to data output OUT0 has reached a stable connected state, the first bit can be passed from data input IN7 to data output OUT0. Similarly, after reaching stable disconnected and connected states to OUT7, the first bit can be passed from data input IN0 to data output OUT7. Thus, in this process, although the control delay is minimized, the information flow to data outputs OUT0 and OUT7 must be stopped in order to allow for enough time to connect new data inputs to new data outputs.

SUMMARY OF THE INVENTION

Systems and methods consistent with the present invention allow for the fast reconfiguration of tree switches. In particular, on-chip parallel control signals are time staggered so that they track the propagation of data or information bits. As a result, it is unnecessary to stop the flow of data bits from the data inputs to the data outputs during the reconfiguration of the tree switch.

To obtain the advantages of, and in accordance with the purpose of the invention, as embodied and broadly described herein, a multi-stage tree switch for selectively coupling one of a plurality of data signals to an output, each stage of the tree switch being controlled by one of a plurality of control signals and its corresponding complement, includes a plurality of latches, each latch receiving one of the plurality of control signals or one of the plurality of complementary control signals and storing the received control signal after receiving a strobe signal, and delay means for providing a delay between a pair of latches and a respective stage receiving a control signal and its corresponding complementary control signal stored by the pair of latches, wherein the delay is equal to the delay between a data signal being received at a first stage of said multi-stage tree switch and the data signal being received at the respective stage.

Both the foregoing general description and the following detailed description provide examples and explanations only. They do not restrict the claimed invention.

DESCRIPTION OF THE DRAWINGS

The accompanying drawings, which are incorporated in and constitute a part of this specification, illustrate embodiments of the invention and, together with the description, explain the advantages and principles of the invention. In the drawings.

FIGS. 3A–3F are diagrams showing the flow of signals through the tree switch circuit of FIG. 2.

DESCRIPTION OF THE PREFERRED EMBODIMENT

Figure 1:
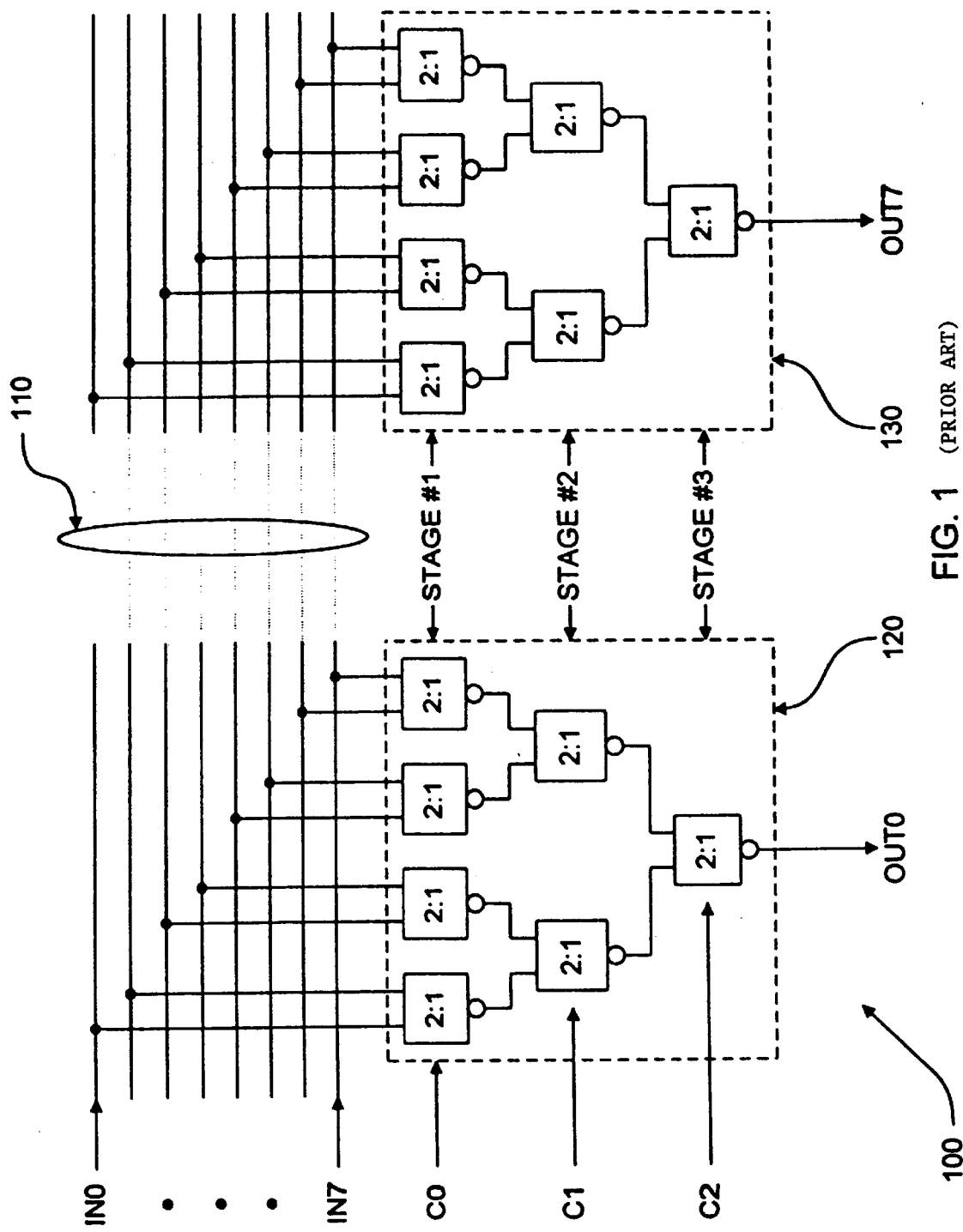
FIG. 1 is a block diagram of a conventional tree switch circuit.

Reference will now be made to preferred embodiments of this invention, examples of which are shown in the accompanying drawings and will be obvious from the description of the invention. In the drawings, the same reference numbers represent the same or similar elements in the different drawings whenever possible.

This invention relates to the fast reconfiguration of a multistage tree switch circuit.

Figure 2:
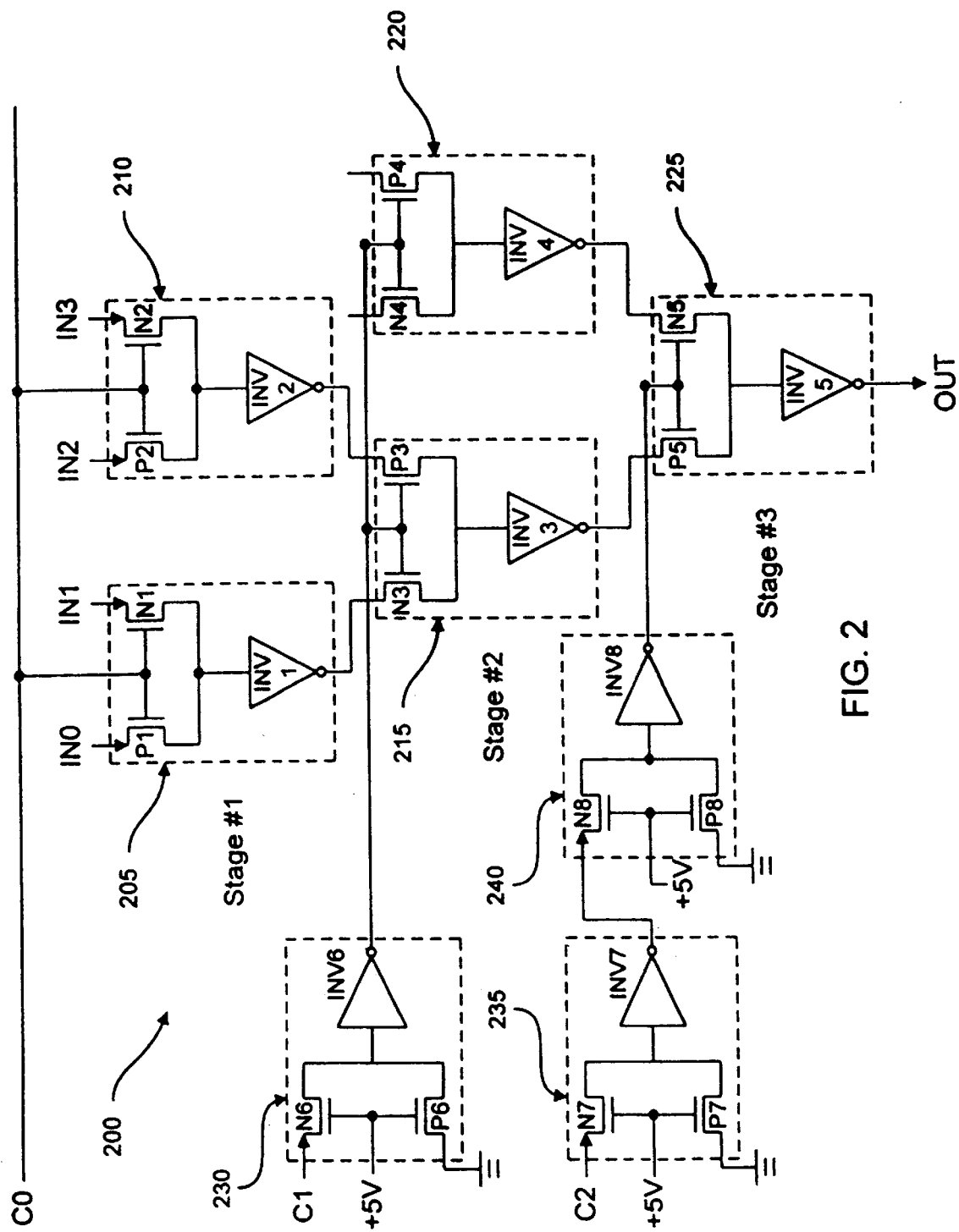
FIG. 2 is a circuit diagram of a tree switch circuit consistent with the present invention.

FIG. 2 shows a circuit diagram for part of an 8×1 tree switch circuit 200 consistent with the present invention. As shown, tree switch circuit 200 includes five selectors 205, 210, 215, 220, and 225 and three delay gates 230, 235, and 240. Selectors 205 and 210 are part of stage #1; selectors 215 and 220 are part of stage #2; and selector 225 is part of stage #3. The selectors are controlled by control signals C0–C2 to selectively couple one of the input signals IN0–IN7 to an output terminal OUT. In a complete version of tree switch 200, stage #1 would include two additional selectors receiving input signals IN4–IN7.

Each of the selectors of tree switch 200 includes one P-type transistor, one N-type transistor, and an inverter. For example, selector 205 includes transistors N1 and P1 and an inverter INV1. The gates of transistors N1 and P1 are coupled together to receive control signal C0. Input signal IN0 is received at the drain of transistor P1, and input signal IN1 is received at the drain of transistor N1. The sources of transistors N1 and P1 are both coupled to the input of inverter INV1. Selector 210 is similarly designed, but with the drains of transistors P2 and N2 receiving input signals IN2 and IN3, respectively.

The outputs from INV1 and INV2 are coupled to the drains of transistors N3 and P3, respectively, of selector 215. The drains of transistors N4 and P4 of selector 220 are coupled to the outputs of the selectors of stage #1 not shown in FIG. 2. The gates of transistors N3 and P3 are both coupled to receive control signal C1 from delay gate 230, as are the gates of transistors N4 and P4. Since control signal C1 is inverted by delay gate 230, the N-type and P-type transistors of the selectors of stage #2 are reversed relative to the N-type and P-type transistors of the selectors of stage #1.

The outputs from inverters INV3 and INV4 are coupled to the drains of transistors P5 and N5, respectively, of selector 225. In addition, the gates of transistors P5 and N5 are coupled to receive control signal C2 from delay gates 235 and 240. Since control signal C2 is inverted twice, once by delay gate 235 and once by delay gate 240, the N-type and P-type transistors of selector 225 are arranged in the same manner as the selectors of stage #1. Inverter INV5 outputs the signal selected by control signal C2 to output terminal OUT.

Delay gates 230, 235, and 240 are identical in design to selectors 205, 210, 215, 220, and 225, and each includes an N-type transistor, a P-type transistor, and an inverter arranged in the same manner as the transistors and inverter of the selectors. In delay gates 230 and 235, the drains of transistors N6 and N7 are coupled to receive control signals C1 and C2, respectively. The gates of transistors N6, P6, N7, P7, N8 and P8 are all tied to a logical high signal, such as 5 volts. Conversely, the drains of transistors P6, P7, and P8 are all tied to ground or logical low signal, such as 0 volts. The output of inverter INV6 is coupled directly to selectors 215 and 220. The output of inverter INV7, however, is coupled to the drain of transistor N8 of delay gate 240. The output of inverter INV8 is coupled to selector 225.

In an alternative design, delay gates 230, 235, and 240 could receive the control signal at the drain of their P-type transistor, have the gates of their transistors tied to a logical low signal, and have the drains of their N-type transistors tied to a logical high signal. The operation of the alternative design would be essentially the same, but would have a slightly different delay due to the differences in mobility between the N-type and P-type transistors. However, by enlarging the P-type transistor, the delays for the two types of transistors could be equalized.

In combination, control signals C0–C2 represent a three-bit binary value, with C2 as the most significant bit and C0 as the least significant bit. This binary value indicates which of the input signals IN0–IN7 is connected to output terminal OUT of tree switch 200. For example if C2 is high (logical 1), C1 is low (logical 0), and C0 is low (logical 0), the corresponding binary value is 100, which equals a decimal value of 4. Thus, for this setting of the control signals, input signal IN4 would be connected to output terminal OUT.

In operation, each individual control signal C0–C2 serves to control the passage of the input data signals through a respective stage of tree switch 200. In stage #1, the level of control signal C0 controls either the P-type transistor or the N-type transistor of a selector to pass a signal to the inverter. Thus, when control signal C0 is low, for example 0V, transistors P1 and P2 conduct, but when control signal C0 is high, for example 5V, transistors N1 and N2 conduct. Thus, if C0 is low, then transistors P1 and P2 would pass input signals IN0 and IN2 to inverters INV1 and INV2, respectively. Conversely, if C0 is high, then transistors N1 and N2 would pass input signals IN1 and IN3 to inverters INV1 and INV2, respectively.

For N-type transistors to conduct, the voltage between the gate and source, Vgs, must exceed a threshold voltage Vt. Similarly, for P-type transistors to conduct, the magnitude of the voltage between the source and gate, Vsg, must also exceed a threshold voltage Vt. For example, if control signal C0 is low and input signal IN0 is low, the voltage level at the source of P1 must exceed Vt. Given Vt is 1V, the source voltage of P1 would have to be at least 1V. Consequently, although the input signal IN0 passes to the input of inverter INV0, the signal is slightly above the low level of the input signal. Similarly, when C0 is high and input signal IN1 is high, the source voltage of N1 could be no greater than 4V. When IN0 is high and IN1 is low, however, the same voltage problems do not occur at the sources of the respective transistors.

To avoid problems that may occur from data signals that exceed the low level input signals or fall below the high level input signals, each selector 205, 210, 215, 220, and 225, includes an inverter INV1, INV2, INV3, INV4, and INV5, respectively, to drive the data signal to a high or low level. Thus, in the above example when the source of transistor P1 becomes 1V when IN0 is 0V and C0 is 0V, the application of 1V to inverter INV0 is low enough to produce 5V at the output of inverter INV0. Similarly, when the source of transistor N1 becomes 4V when IN1 is 5V and C0 is 5V, the application of 4V to inverter INV0 is high enough to produce 0V at the output of inverter INV0. As long as the low signal applied to the inverter is less than about 2V and the high signal is greater than about 3V, the inverter will produce the appropriate output.

Since the inverter inverts the input signal, the number of stages of tree switch 200 should preferably be even to ensure the data signal at the output of the switch is the same as the input signal. However, when the number of stages is odd, as shown in FIG. 2, an additional inverter (not shown) should preferably be included at the output of the switch to ensure the equality of the input signal to the data signal at the output of the switch.

As an input signal passes through a stage of tree switch circuit 200, there is a delay between the time the input signal is received by the stage and the time the selected data signal is received by the next stage. For example, after input signals IN0–IN7 are received by the selectors of stage #1, the selected information signals are subsequently received at stage #2 after a delay d, such as one nanosecond or less. Since the design of delay gate 230 is identical to the selectors of tree switch circuit 200, delay gate 230 delays control signal C1 by the same delay d. As a result, control signal C1 arrives at the gates of the transistors of selectors 215 and 220 of stage #2 at the same time the information signals are received by the drains of the same transistors of stage #2. The delay d corresponds to a time cycle at which new information signals are applied as input signals IN0–IN7 and new control signals are applied as control signals C0–C2. In other words, in each cycle, new input signals IN0–IN7 and new control signals C0–C2 are received by tree switch 200 every delay time d.

The information signals received at stage #2 are similarly delayed by a delay d before being received by stage #3. Since the information signals passing through stage #2 have already been delayed by a delay d, the total delay between the time an information signal is received by stage #1 and subsequently received by stage #3 is 2d. At the same time, control signal C2 passes through delay gates 235 and 240, which also provide a delay of 2d. Thus, control signal C2 is received by the gates of the transistors of selector 225 of stage #3 at the same time the selected information signals are received by the drains of the same transistors of stage #3.

By delaying the application of the control signals to the stages of tree switch circuit 200, the control signals arrive at a stage at the same time as the information signals. As a result, it is unnecessary to stop the flow of the information signals when connecting a new input to a new output. As explained below, the illustrations shown in FIGS. 3A–3F provide an example of how a new connection is made without any delay or stoppage of the flow of information.

In a first cycle shown in FIG. 3A, which corresponds to an initial time 0, control signals C0–C2 have been set to a logical 0. This setting of the control signals corresponds to the binary value 000, such that tree switch circuit 200 is set to connect input signal IN0 to output terminal OUT. Also, as shown in FIG. 3A, all of the information signals received in this cycle, as well as in several previous cycles, at the input of stage #1 as input signals IN0–IN7 are 0. The subscript next to the value of each information signal represents the input at which that information signal was received.

Since control signal C0 is set to 0, the selectors of stage #1 are set to pass input signals IN0, IN2, IN4, and IN6 to the input of stage #2. Furthermore, since control signal C1 is also set to 0, the selectors of stage #2 are set to pass input signals IN0 and IN4 to the input of stage #3. Finally, since control signal C2 is set to 0, the selector of stage #3 is set to pass input signal IN0 to output terminal OUT. In each of FIGS. 3A–3F, the circled signal in a stage is the signal destined to be passed to output terminal OUT.

In the second cycle shown in FIG. 3B, which corresponds to a time d after the first cycle, the control signals are each changed to a logical 1 so as to connect input signal IN7 to output terminal OUT. In addition, all the information signals received at the input of stage #1 as input signals IN0–IN7 have also changed to a logical 1. Since control signal C0 is not delayed, as shown in FIG. 2, the value of control signal C0 applied to stage #1 immediately changes to 1. Thus, the settings of the selectors of stage #1 are changed such that input signals IN1, IN3, IN5, and IN7 will be received at the input of stage #2 at time 2d. In other words, the information signals received in the beginning of this cycle as input signals IN1, IN3, IN5, and IN7 will be passed to the input of stage #2 at the beginning of the next cycle.

However, since as shown in FIG. 2 control signals C1 and C2 are delayed by one cycle and two cycles, respectively, their values remain unchanged in the second cycle. Specifically, the change in the value of control signal C1 will not be received by stage #2 until time 2d. Similarly, the change in the value of control signal C2 will not be received by stage #3 until time 3d. As a result, since the value of control signal C1 at stage #2 is still low in the second cycle, the selectors of stage #2 remain set to pass input signals IN0 and IN4 to the input of stage #3 at time 2d. In addition, the selector of stage #3 remains set to pass input signal IN0 to output terminal OUT at time 2d.

In the third cycle shown in FIG. 3C, corresponding to time 2d, control signal signals C0–C2 remain a logical 1, as they do through the remaining cycles of the illustration. The information signals received at the input of stage #1 as input signals IN0–IN7 also remain a logical 1 through the remaining cycles. Since control signal C0 remains a logical 1, the settings of the selectors of stage #1 are unchanged. Consequently, input signals IN1, IN3, IN5, and IN7 continue to pass to the input of stage #2.

In this cycle, however, the value of control signal C1 received by stage #2 has changed to a logical 1. As a result, the selectors of stage #2 are changed such that input signals IN3 and IN7 will be received at the input of stage #3 at time 3d. The value of control signal C2 applied to stage #3 remains a logical 0, however, because of the two cycle delay imparted to control signal C2. As a result, the selectors of stage #3 remain set to pass input signal IN0 to output terminal OUT at time 3d.

The fourth cycle shown in FIG. 3D corresponds to time 3d. In this cycle, the information signal received as input signal IN0 at the input of stage #1 in the first cycle is finally received at output terminal OUT. At the same time, the value of control signal C2 applied to stage #3 becomes a logical 1, while control signals C0 and C1 remain a logical 1. As long as control signals C0–C2 remain high, all information signals received as input signal IN7 at the input of stage #1 are passed to output terminal OUT. For example, in the fifth cycle at time 4d shown in FIG. 3E, the information signal first received as input signal IN7 in the second cycle is received at the output terminal OUT. Similarly, in the sixth cycle shown in 3F, output terminal OUT receives the information signal first received as input signal IN7 in the third cycle.

In FIG. 3A, corresponding to the first cycle, tree switch circuit 200 is set to pass the information signal received as input signal IN0 to output terminal OUT. In the fourth cycle, corresponding to the passage of the selected information signal through the three stages of tree switch circuit 200 and a delay time of 3d, that information signal is received at output terminal OUT. In the second cycle, shown in FIG. 3B, the control signals are changed to pass the information signal received as input signal IN7 to output terminal OUT. In the fifth cycle, the information signal received as input signal IN7 in the second cycle is received at output terminal OUT. Thus, when control signals C0–C2 are changed to connect information signals received as input signal IN7 to output terminal OUT, the information signals received as input signal IN7 are received at output terminal OUT in the cycle immediately after the last information signal received as input signal IN0 is received at output terminal OUT. Therefore, as demonstrated by the example illustrated in FIGS. 3A–3F, tree switch circuit 200 makes a new connection between an input signal and the output without any delay or stoppage of the flow of information signals.

Figure 4:
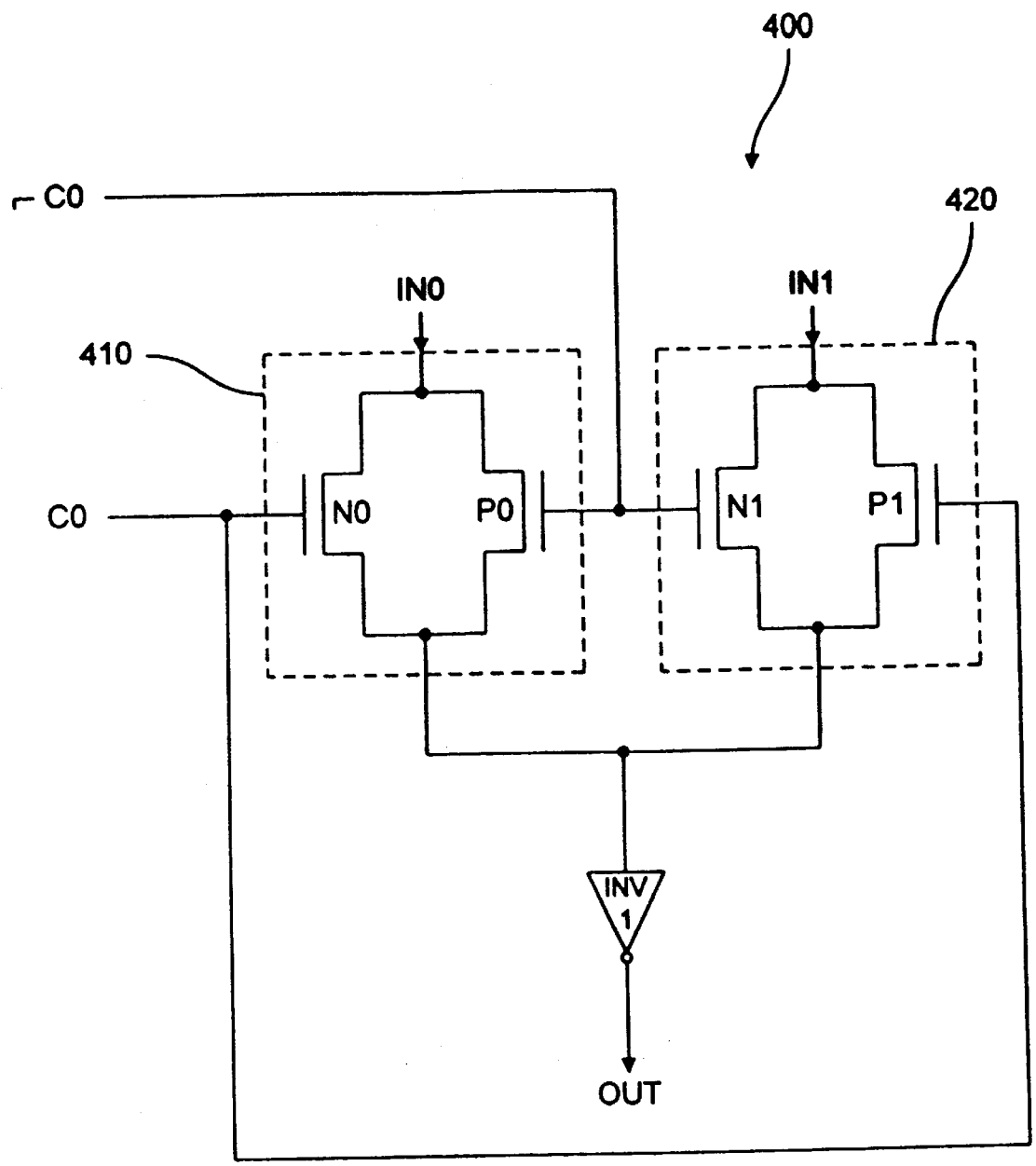
FIG. 4 is a circuit diagram of a selector switch for the tree switch circuit of FIG. 2.

As shown in FIG. 2, the selectors of tree switch circuit 200 each include a single N-type transistor and a single P-type transistor. The selectors, however, are not limited to this design. FIG. 4 shows a circuit diagram for a selector 400, consistent with the present invention, which can also be used in tree switch circuit 200 of FIG. 2. In contrast to the selectors shown in FIG. 2, selector 400 includes two N-type transistors N0 and N1 and two P-type transistors P0 and P1. Selector 400 further includes an inverter INV1 and receives a control signal, such as C0, and its complement, ‾C0.

Each N-type transistor of selector 400 is coupled in parallel with a corresponding P-type transistor to form a pass gate. Specifically, transistors N0 and P0 form a pass gate 410, and transistors N1 and P1 form a pass gate 420. In pass gate 410, the drains of transistors N0 and P0 are coupled together to receive input signal IN0. Similarly, the drains of transistors N1 and P1 of pass gate 420 are coupled together to receive input signal IN1. In addition, control signal C0 is coupled to the gates of transistors N0 and P1, and complementary control signal ‾C0 is coupled to the gates of transistors P0 and N1.

In each pass gate, the N-type transistor will pass a low signal when its gate receives a high signal, and the P-type transistor will pass a high signal when its gate receives a low signal. Because the N-type and P-type transistors in each pass gate receive complementary signals at their respective gates, both transistors either conduct or do not conduct. Moreover, since a conducting N-type transistor can pass a low signal and a conducting P-type transistor can pass a high signal, each pass gate, when conducting, will pass the signal level of the received input signal and pass it to its output, i.e. the sources of the transistors.

For pass gates 410 and 420, the level of control signal C0 determines which pass gate conducts. When C0 is high and ‾C0 is low, pass gate 410 conducts and input signal IN0 is passed to the input of inverter INV1. Conversely, when C0 is low and ‾C0 is high, pass gate 420 conducts, passing input signal IN1 to the input of inverter INV1.

The design of selector 400 provides for a faster selector switch than the selector design shown in FIG. 2. In addition, due to the greater conduction from the N-type and P-type transistors in the pass gate design, the input signal passed to the outputs of the pass gates will have the same voltage level as the input signal, i.e. 0V or 5V, thus obviating the need for an inverter in certain cases. Although an inverter is shown in FIG. 4, inverter INV1 is so included to provide a buffer between selectors of subsequent stages of the tree switch and to improve the speed of the circuit.

Figure 5:
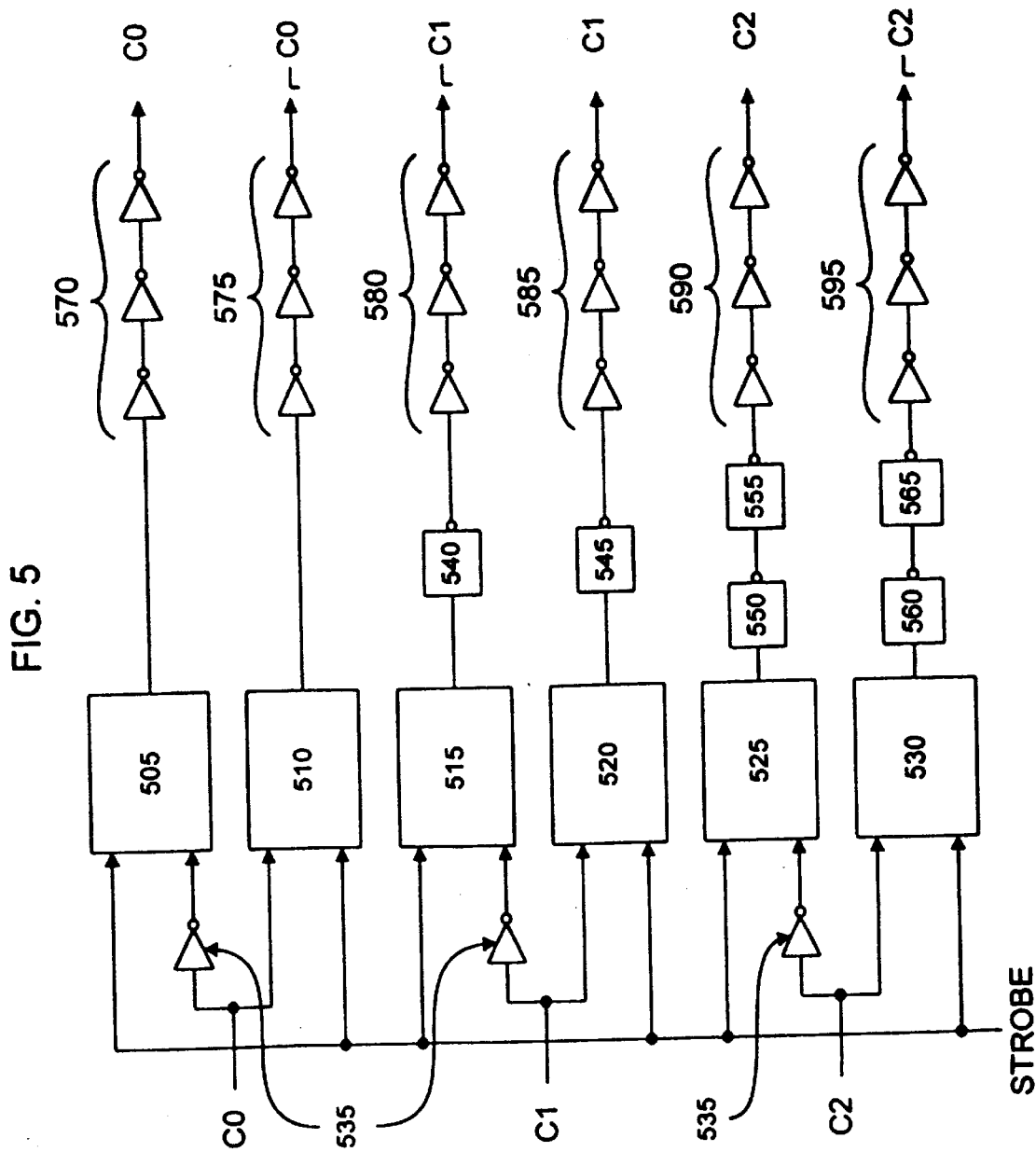
FIG. 5 is a block diagram of a control circuit for the control signals applied to the tree switch circuit of FIG. 2.

For a tree switch circuit with selectors having the design of selector 400, it is important that the both the true and complementary signals are applied to the selectors at the same time to avoid outputting incorrect information signals from the tree switch. FIG. 5 is a block diagram of a control circuit 500, consistent with the present invention, for applying the control signals to the selectors of tree switch circuit 200 of FIG. 2. As shown in FIG. 5, control circuit 500 includes six latches 505, 510, 515, 520, 525, and 530, and six delay gates 540, 545, 550, 555, 560, and 565. Control circuit 500 further includes inverters 535 and six amplifiers 570, 575, 580, 585, 590, and 595. Each of the amplifiers comprise three serially-coupled inverters and acting as drivers.

Each of the latches receives a control signal, either the true or complementary signal, and a strobe signal ST. For latches 505, 515, and 525, one of the inverters 535 is coupled between a control signal and an input of the latch such that the complementary value of the control signal is applied to the latch. For example, latch 505 receives control signal ‾C0 at one of its inputs.

Since control signals C0 and ‾C0 are not delayed before being applied to the selectors of stage #1, the output of latches 505 and 510 are coupled directly to amplifiers 570 and 575, respectively. The outputs of the amplifiers are applied directly to the selectors of stage #1 of tree switch 200. The amplifiers, although not always required, are included in control circuit 500 to help maintain the voltage levels of the control signals, to drive the transistors of the selectors receiving the control signals, and to improve the speed of the circuit.

Control signals C1, C2, and their respective complements, however, do require a delay before being applied to the selectors of tree switch circuit 200, as described above. In particular, control signals C1 and ‾C1 both require a single delay d before being received by the selectors of stage #2. Consequently, delay gates 540 and 545, like delay gate 230 of FIG. 2, are coupled to the output of latches 515 and 520, respectively, to provide the required delay. The outputs of delay gates 540 and 545 are coupled to amplifiers 580 and 585, respectively, which provide control signals C1 and C1 to the selectors of stage #2.

Control signals C2 and ‾C2, on the other hand, both require a delay of 2d. To provide this delay, as provided by delay gates 235 and 240 in FIG. 2, control circuit 500 includes delay gates 550 and 555 coupled in series to the output of latch 525 and delay gates 560 and 565 coupled in series to the output of latch 530. Amplifiers 590 and 595, which provide control signals C2 and ‾C2 to the selectors of stage #3, are coupled to the outputs of delay gates 555 and 565, respectively.

Since each of the delay gates includes an inverter (see FIG. 2 and FIG. 4), the control signals output from the latches are inverted once by each delay gate and three times by the amplifiers. For example, control signal C2 output from latch 530 is inverted five times, once each by delay gates 560 and 565 and three times by amplifier 595. Thus, the output from amplifier 595 is ‾C2.

Figure 6:
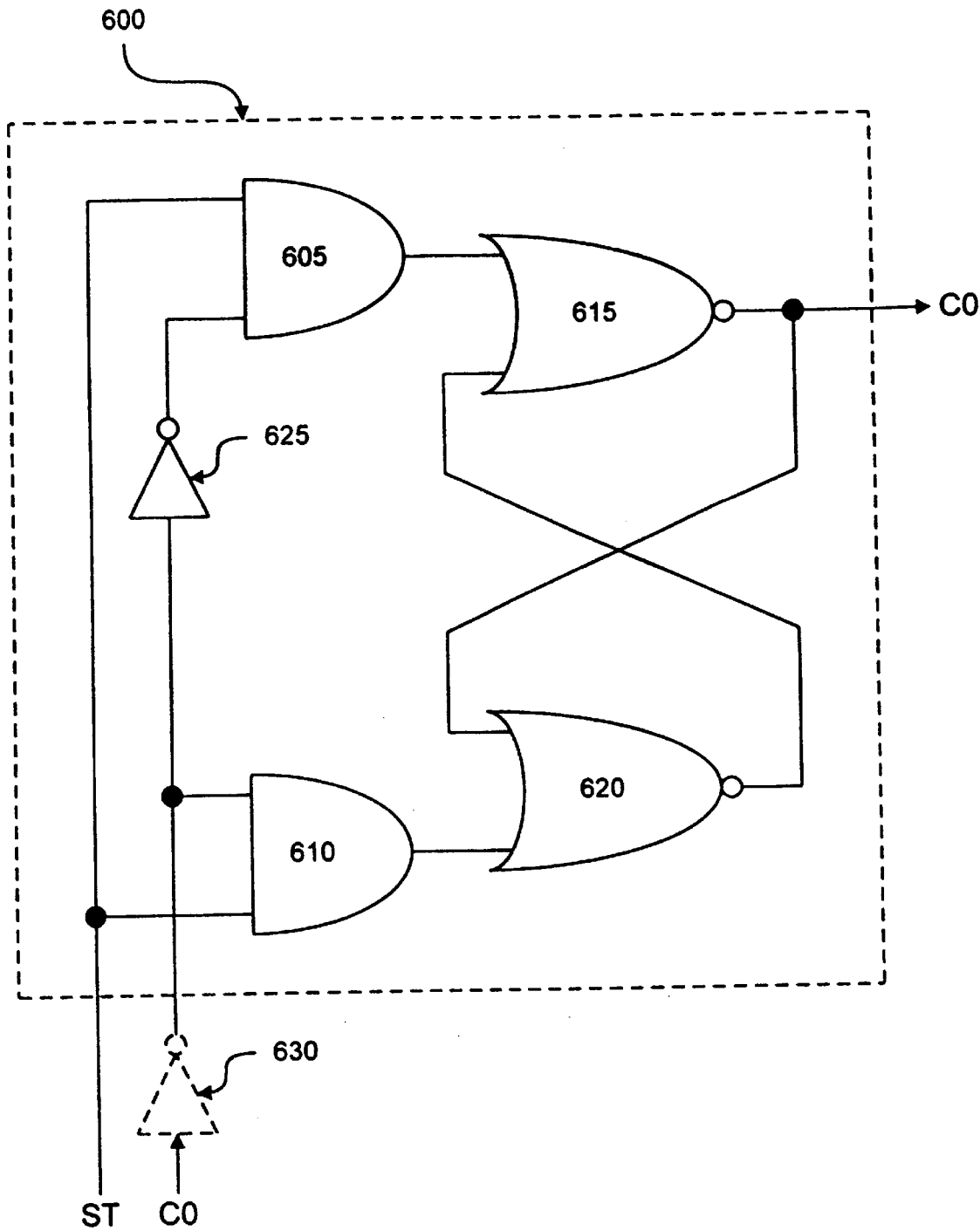
FIG. 6 is a circuit diagram of a latch used in the control circuit of FIG. 5.

To ensure that each pair of control signals, i.e. the true and complementary values, is applied to the selectors of the tree switch circuit at the same time, the latches of control circuit 500 each store and output the control signals in response to a strobe signal. FIG. 6 is a circuit diagram of a latch 600, consistent with the present invention, which can be used in control circuit 500 and which demonstrates how the control signals are stored and output at the same time. Latch 600 includes two AND gates 605 and 610, two NOR gates 615 and 620, and an inverter 625. An inverter 630 corresponds to an inverter of inverters 535 shown in FIG. 5. Latch 600 receives the true value of the control signal when inverter 630 is not included, and receives the complementary value when inverter 630 is included.

Assuming that inverter 630 is not included, AND gate 610 receives the true value of the control signal, for example C0, at an input, whereas AND gate 605 receives the value inverted by inverter 625 at an input. Both AND gates 605 and 610 receive strobe signal ST at the other input. NOR gates 615 and 620 are coupled to receive the outputs of AND gates 605 and 610, respectively, at an input. In addition, NOR gates 615 and 620 are cross-coupled such that the output of NOR gate 615 is coupled to an input of NOR gate 620 and vice versa. Latch 600 outputs the control signal it stores from the output of NOR gate 615.

In operation, latch 600 stores the value of control signal C0 each time strobe signal ST becomes a high signal. For example, assume that the stored value of control signal C0, i.e., the value at the output of NOR gate 615, is high, the value of strobe signal ST is low, and the value of control signal C0 is being changed to low. In other words, the value of control signal C0 at the input of latch 600 is low. In such a state, the outputs of AND gates 605 and 610 are both low because strobe signal ST is low. In addition, the output of NOR gate 620 is low because one of its inputs is coupled to the output of NOR gate 615, which is high. Consequently, the output of NOR gate 615 is high because both of its inputs are low.

When strobe signal ST changes to high, the output of AND gate 610 remains low, but AND gate 605 changes to high. As a result, the output of NOR gate 615 becomes low. This change to the output of NOR gate 615 makes both of the inputs of NOR gate 620 low, which in turn changes the output of NOR gate 620 to high. Consequently, both of the inputs of NOR gate 615 become high, which maintains the output of NOR gate 615 low. Thus, as shown by this example, latch 600 stores the received value of control signal C0 when ST changes to high. Since each of the latches of control circuit 500 receive strobe signal ST at the same time, each of the latches stores the control signal it receives at the same time. As a result, the control signals are applied to the selectors of tree switch 200 at the same time.

CONCLUSION

A system and method consistent with the present invention allows for the fast reconfiguration of tree switches. In particular, on-chip parallel control signals are time staggered so that they track the propagation of data or information bits. As a result, it is unnecessary to stop the flow of data bits from the data inputs to the data outputs during the reconfiguration of the tree switch.

It will be apparent to those skilled in the art that various modifications and variations can be made to disclosed embodiments of the present invention without departing from the scope or spirit of the invention. Other embodiments of the invention will be apparent to those skilled in the art from consideration of the specification and practice of the embodiments of the invention disclosed herein. The specification and examples should be considered exemplary, with the true scope and spirit of the invention being indicated by the following claims and their full range of equivalents.

What is claimed is:

1. A method for selectively coupling one of a plurality of data signals received at a first stage of a multi-stage tree switch to an output of a last stage of said multi-stage tree switch, each stage of said tree switch being controlled by one of a plurality of control signals and its corresponding complement, said method comprising the steps of:

storing each one of the plurality of control signals and its corresponding complementary control signal in one of a plurality of pairs of latches; and delaying the reception of a control signal and its corresponding complementary control signal stored by one of the plurality of pairs of latches at a stage of said multi-stage tree switch controlled by the control signals stored by the respective pair of latches, wherein the delay between the respective pair of latches and the stage controlled by the control signals stored by the respective pair of latches is equal to the delay between a data signal being received at a first stage of said multi-stage tree switch and the data signal being received at the stage controlled by the control signals stored by the respective pair of latches.

2. The method according to claim 1, wherein the delay between a first pair of latches and the first stage of said multi-stage tree switch controlled by the control signals stored by the first pair of latches is zero.

3. A method for selectively coupling one of $2^N$ data signals received at a first stage of an N-stage tree switch to an output of a last stage of said N-stage tree switch, N being an integer greater than one, each stage of said tree switch being controlled by one of N control signals and one of N complementary control signals, said method comprising the steps of:

storing each one of the N control signals and its corresponding complementary control signal in one of N pairs of latches; and delaying the reception of a control signal and its corresponding complementary control signal stored by a pair of latches at a stage of said N-stage tree switch controlled by the control signals stored by the respective pair of latches, wherein the delay between the respective pair of latches and the stage controlled by the control signals stored by the respective pair of latches is equal to the delay between a data signal being received at a first stage of said N-stage tree switch and the data signal being received at the stage controlled by the control signals stored by the respective pair of latches.

* * * * *